(12) United States Patent
Kim

(10) Patent No.: US 10,236,475 B2
(45) Date of Patent: *Mar. 19, 2019

(54) MASK FRAME ASSEMBLY AND MANUFACTURING METHOD THEREOF

(71) Applicant: Samsung Display Co., Ltd., Yongin-si (KR)

(72) Inventor: Sanghoon Kim, Yongin-si (KR)

(73) Assignee: Samsung Display Co., Ltd, Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/616,866

(22) Filed: Jun. 7, 2017

(65) Prior Publication Data

US 2017/0365822 A1    Dec. 21, 2017

(30) Foreign Application Priority Data

Jun. 15, 2016    (KR) .......................... 10-2016-0074731

(51) Int. Cl.
| | | |
|---|---|---|
| *C23C 14/04* | (2006.01) | |
| *C23C 16/04* | (2006.01) | |
| *H01L 51/00* | (2006.01) | |
| *H01L 51/56* | (2006.01) | |
| *H01L 27/32* | (2006.01) | |
| *H01L 51/52* | (2006.01) | |

(52) U.S. Cl.
CPC ............ *H01L 51/56* (2013.01); *C23C 14/042* (2013.01); *H01L 27/3246* (2013.01); *H01L 51/0011* (2013.01); *H01L 51/525* (2013.01); *C23C 16/042* (2013.01); *H01L 2227/323* (2013.01)

(58) Field of Classification Search
None
See application file for complete search history.

(56) References Cited

U.S. PATENT DOCUMENTS

| 9,997,708 B2 * | 6/2018 | Kim ...................... C23C 14/042 |
| 2010/0192856 A1 * | 8/2010 | Sung ..................... C23C 14/042 |
| | | 118/721 |
| 2011/0139069 A1 * | 6/2011 | Ahn ...................... C23C 14/042 |
| | | 118/504 |
| 2012/0279444 A1 * | 11/2012 | Hong .................... C23C 14/042 |
| | | 118/504 |

(Continued)

FOREIGN PATENT DOCUMENTS

| KR | 10-2010-0000129 | 1/2010 |
| KR | 10-1030030 | 4/2011 |

(Continued)

*Primary Examiner* — Binu Thomas
(74) *Attorney, Agent, or Firm* — H.C. Park & Associates, PLC

(57) ABSTRACT

A mask frame assembly including a frame, a mask coupled to the frame and including a pattern region for deposition, and a partitioning stick coupled to the frame and configured to partition the pattern region of the mask into unit cell patterns. The partitioning stick includes a pair of opposing fixing ends fixed to sides of the frame, and a narrow width portion connecting the pair of fixing ends and including a first partitioning portion and a second partitioning portion respectively recessed inwards from both edges of the fixing ends in a width direction to maintain rigidity balance between the first and second partitioning portions.

7 Claims, 7 Drawing Sheets

(56) References Cited

U.S. PATENT DOCUMENTS

| | | | | |
|---|---|---|---|---|
| 2012/0325143 A1* | 12/2012 | Kang | ............... | C23C 14/042 |
| | | | | 118/504 |
| 2014/0137798 A1 | 5/2014 | Ahn et al. | | |
| 2015/0013600 A1* | 1/2015 | Hsu | ............... | C23C 14/042 |
| | | | | 118/504 |
| 2015/0159267 A1* | 6/2015 | Ochi | ............... | C23C 14/042 |
| | | | | 118/721 |
| 2016/0005970 A1* | 1/2016 | Kwen | ............... | C23C 14/042 |
| | | | | 118/504 |
| 2016/0079532 A1* | 3/2016 | Yi | ............... | C23C 14/042 |
| | | | | 118/720 |
| 2017/0141313 A1* | 5/2017 | Min | ............... | C23C 14/042 |
| 2017/0207390 A1* | 7/2017 | Kim | ............... | C23C 14/042 |
| 2017/0222145 A1* | 8/2017 | Kim | ............... | H01L 51/56 |

FOREIGN PATENT DOCUMENTS

| | | |
|---|---|---|
| KR | 10-2016-0005272 | 1/2016 |
| KR | 10-2016-0033337 | 3/2016 |

\* cited by examiner

MASK FRAME ASSEMBLY AND MANUFACTURING METHOD THEREOF

CROSS-REFERENCE TO RELATED APPLICATION

This application claims priority from and the benefit of Korean Patent Application No. 10-2016-0074731, filed on Jun. 15, 2016, which is hereby incorporated by reference for all purposes as if fully set forth herein.

BACKGROUND

Field

Exemplary embodiments relate to a mask frame assembly for depositing a thin film, and a method of manufacturing the mask frame assembly.

Discussion of the Background

Generally, organic light-emitting devices may display color by emitting light when holes and electrons injected from anodes and cathodes recombine in emission layers. Organic light-emitting devices may generally include pixels having a stack-type structure, in which an emission layer is disposed between a pixel electrode which is an anode and an opposite electrode which is a cathode.

Each of the pixels may be a sub-pixel of one of, for example, a red pixel, a green pixel, and a blue pixel, and a desired color may be expressed by color combination of these three color sub-pixels. That is, each sub-pixel has a structure in which the emission layer emitting light of one of red, green, and blue is disposed between the two electrodes, and color of a unit pixel is expressed by an appropriate combination of these three color lights.

The electrodes, the emission layer, and the like of an organic light-emitting device may be formed by deposition. That is, a thin film having a desired pattern may be formed on a substrate by arranging a mask frame assembly having the same pattern as that of a thin film layer to be formed, and depositing a raw material of the thin film on the substrate by using the mask frame assembly.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a mask frame assembly and a method of manufacturing the same, which includes a partitioning stick for partitioning a pattern region of a mask into unit cell patterns that may be prevented from deformation during the manufacturing process thereof.

Additional aspects will be set forth in the detailed description which follows, and, in part, will be apparent from the disclosure, or may be learned by practice of the inventive concept.

According to an exemplary embodiment, a mask frame assembly includes a frame, a mask coupled to the frame and including a pattern region for deposition, and a partitioning stick coupled to the frame and configured to partition the pattern region of the mask into unit cell patterns. The partitioning stick includes a pair of opposing fixing ends fixed to sides of the frame, and a narrow width portion connecting the pair of fixing ends and including a first partitioning portion and a second partitioning portion respectively recessed inwards from both edges of the fixing ends in a width direction.

The first partitioning portion may define a first boundary line of the unit cell patterns, and the second partitioning portion may define a second boundary line of the unit cell patterns opposing the first boundary line.

The first partitioning portion may non-linearly connect the pair of fixing ends, and the second partitioning portion may linearly connect the pair of fixing ends.

The first partitioning portion may include a concave portion and a protruding portion alternately disposed with each other.

A slope may be formed with respect to the width direction between the concave portion and the protruding portion.

The second partitioning portion may include a pair of step portions recessed in parallel to the width direction and inward from the pair of fixing ends, and a linear portion linearly connecting the pair of step portions.

The mask may cross the partitioning stick at right angles.

According to an exemplary embodiment, a method of manufacturing a mask frame assembly includes: forming a frame; forming a mask including a pattern region for deposition; forming a partitioning stick including a pair of fixing ends each disposed on end sides of the partitioning stick, and a narrow width portion connecting the pair of fixing ends and including a first partitioning portion and a second partitioning portion respectively recessed inwards from both edges of the fixing ends in a width direction; fixing the pair of fixing ends of the partitioning stick to the frame; and fixing the mask to the frame such that the pattern region is partitioned into unit cell patterns by the first partitioning portion and the second partitioning portion of the partitioning stick.

According to an exemplary embodiment, a mask frame assembly includes a frame, a plurality of masks each including a pattern region, and a partitioning stick crossing the masks. The partitioning stick includes fixing ends fixed to the frame and having a first width, and a narrow width portion connecting the fixing ends and having a second width less than the first width.

The narrow width portion may include an upper non-linear side and a lower linear side.

The upper non-linear side may include protrusions each formed between adjacent masks.

The narrow width portion may include a slanted portion overlapping each pattern region of the masks.

The partitioning stick may divide pattern regions of the masks into a plurality of unit cells in plan view, and each of the unit cells may have a greater height at a middle portion thereof than an end portion thereof.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
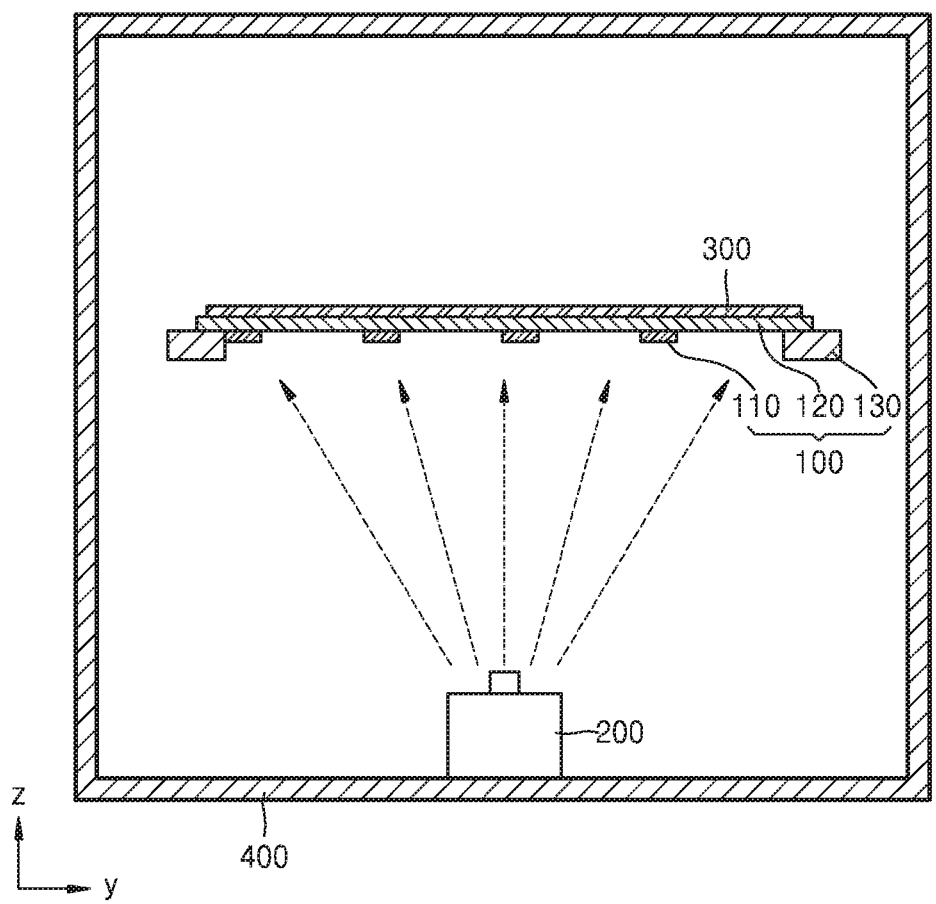
FIG. 1 shows a deposition process using a mask frame assembly according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 schematically shows a structure of a thin film deposition apparatus using a mask frame assembly 100 according to an exemplary embodiment.

Referring to FIG. 1, the thin film deposition apparatus includes the mask frame assembly 100 for forming a desired pattern on a substrate 300, which is a deposition target, and a deposition source 200 that ejects a deposition gas toward the substrate 300 within a chamber 400. When the deposition source 200 ejects the deposition gas within the chamber 400, the deposition gas is deposited on the substrate 300 via the mask frame assembly 100, and thus, a thin film having a predetermined pattern is formed. In this respect, the mask frame assembly 100 includes a frame 130, a mask 120, and a partitioning stick 110, and a detailed structure thereof is as shown in FIG. 2.

Figure 2:
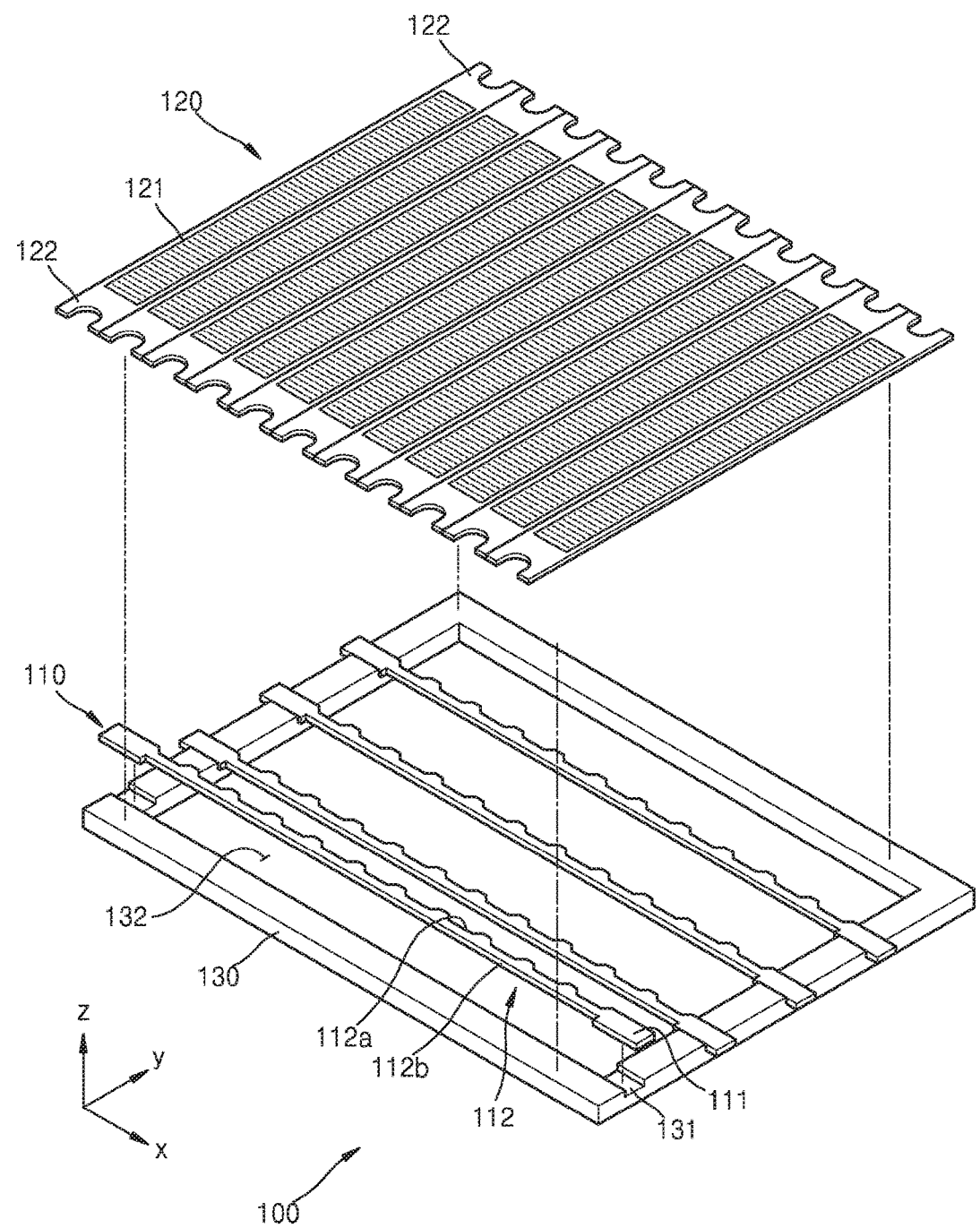
FIG. 2 is an exploded perspective view of the mask frame assembly of FIG. 1.

Referring to FIG. 2, the mask frame assembly 100 according to an exemplary embodiment includes the frame 130, partitioning sticks 110 each having both ends fixed to the frame 130, and masks 120 crossing the partitioning sticks 110 at right angles and each having both ends fixed to the frame 130.

The frame 130 forms an outer frame of the mask frame assembly 100, and has a rectangular shape having an opening 132 at the center thereof. Combining grooves 131 are formed on a pair of sides of the frame 130 that face each other, and thus, both fixing ends 111 of each of the partitioning sticks 110 are fixed to the combining grooves 131 by welding or the like. Further, both ends of each of the masks 120 are fixed by welding or the like to another pair of sides that are perpendicular to the pair of sides to which each of the partitioning sticks 110 is fixed or welded. Hereinafter, the partitioning sticks 110 and the masks 120 according to exemplary embodiments will be described as being fixed to the frame 130 via welding, for convenience of description.

The masks 120 are partitioning stick-shaped members and include pattern regions 121 that correspond to the opening 132. As described above, both ends of each of the masks 120 are welded to the frame 130. The masks 120 are welded to the frame 130 while clamping portions 122 are held and extended in a length direction. After the welding, the clamping portions 122 are removed by cutting. The masks 120 may be in a form of a single large member, however, the mask 120 formed as a single large member may cause severe sagging due to its weight. Thus, as shown in FIG. 2, the masks 120 are formed into multiple sticks. The masks 120 may include, for example, nickel (Ni) or a Ni-cobalt alloy.

Each of the pattern regions 121 includes pattern holes formed therein. As deposition vapor passes through the pattern holes during deposition, a thin film layer is formed on the substrate 300 (refer to FIG. 1). The pattern region 121 is formed in the mask 120 without being divided into unit cell patterns, and the partitioning sticks 110 may partition the pattern regions 121 into unit cell patterns.

Each of the partitioning sticks 110 includes a pair of fixing ends 111 fixed to the combining grooves 131 of the frame 130 by welding, and a narrow width portion 112 connecting the pair of fixing ends 111. A width of the narrow width portion 112 is less than that of the pair of fixing ends 111. A first partitioning portion 112a and a second partitioning portion 112b formed in the narrow width portion 112 to partition the pattern regions 121 of the masks 120 into unit cell patterns.

Partitioning the unit cell pattern will be described in detail with reference to FIG. 3.

Figure 3:
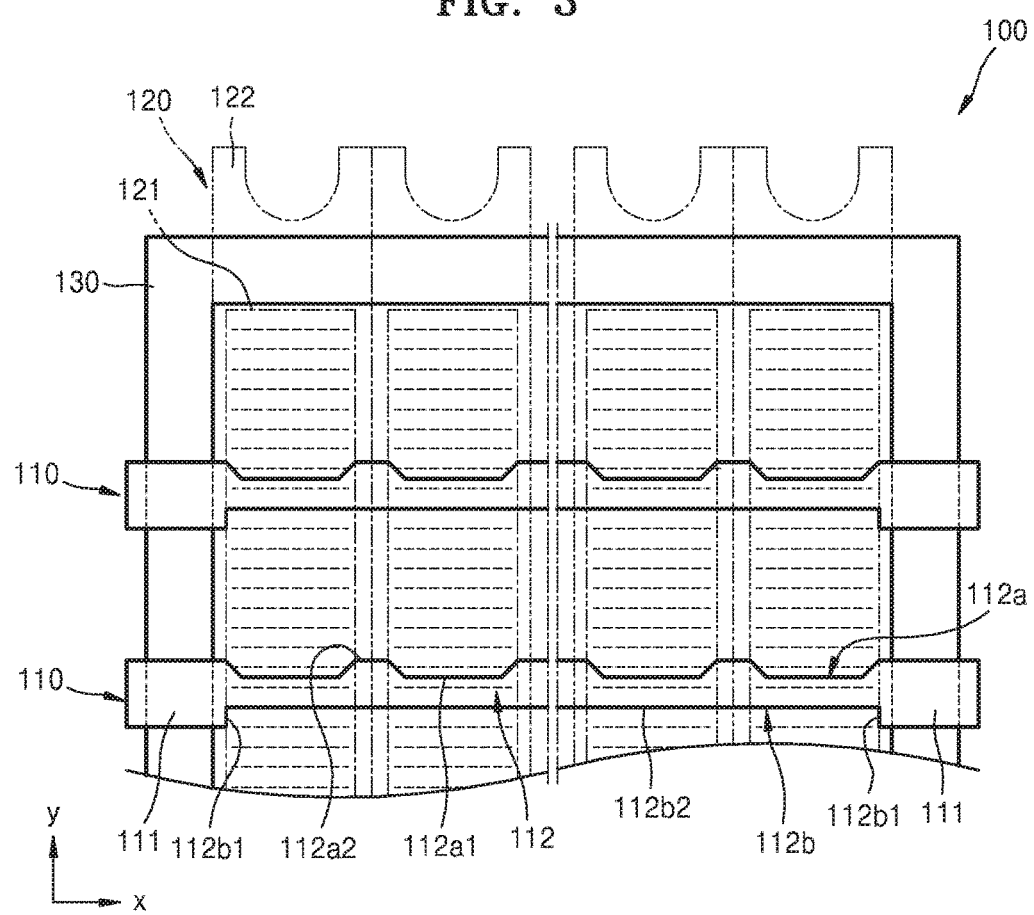
FIG. 3 is a partial plan view of the mask frame assembly of FIG. 2.

As shown in FIG. 3, the masks 120 and the partitioning sticks 110 are adhered to the frame 130 and the masks 120 and the partitioning sticks 110 cross each other at right angles. Thus, narrow width portions 112 of the partitioning sticks 110 cross the pattern region 121 of each of the masks 120, and first partitioning portions 112a and second partitioning portions 112b of the narrow width portions 112 divide the pattern region 121 into unit cell patterns.

More particularly, the first and second partitioning portions 112a and 112b may be utilized to define boundary lines between unit cells. For example, as shown in FIG. 3, the first partitioning portion 112a draws a lower boundary line of the unit cells, and the second partitioning portion 112b of an adjacent narrow width portion 112 draws an upper boundary line of the unit cells.

As described above, the width of the narrow width portion 112 is less than the width of the pair of fixing ends 111. As such, the first partitioning portion 112a and the second partitioning portion 112b are respectively depressed inwards from both edges of the pair of fixing ends 111 in a width direction (Y-axis direction). That is, the pair of fixing ends 111 extend in the width direction from the first and second partitioning portions 112a and 112b, respectively. In this manner, the partitioning sticks 110 may be prevented from being deformed, such that unit cells may be partitioned atypically as shown in FIG. 3. That is, unit cells partitioned according to an exemplary embodiment have at least one non linear boundary line.

For example, if each of the unit cells is partitioned to have a rectangular shape, the partitioning sticks 110 may also be formed as linear poles having the first and second partitioning portions 112a and 112b that are linear to each other. In such a case, when the partitioning sticks 110 are extended in a length direction (X-axis direction) to weld the partitioning sticks 110 to the frame 130, the partitioning sticks 110 may not be bent when force is focused to one side, as the linear poles have a symmetric structure. When ends of the unit cell of the pattern regions 121, to which boundary lines are to be drawn by the partitioning sticks 110, are not linear, however, a problem may arise when the partitioning sticks 110 are extended for welding.

More particularly, as shown in FIG. 3, according to an exemplary embodiment, lower portions of unit cells of the pattern regions 121 are not linear, and thus, the first partitioning portions 112a of the partitioning sticks 110 have a non-linear structure, in which concave portions 112a1 and protruding portions 112a2 are alternately arranged and are connected to each other with a sloped portion therebetween. In addition, since the second partitioning portions 112b on the opposite side of the first partitioning portions 112a draw linear boundary lines as shown in FIG. 3, the second partitioning portions 112b may each be formed as a straight line, without being recessed inwards from edges of both of the pair of fixing ends 111 in the width direction. However, in this case, rigidity balance between the first partitioning portions 112a and the second partitioning portions 112b may be considerably changed, and thus, the partitioning sticks 110 may be bent convexly towards the first partitioning portions 112a, for example, when the partitioning sticks 110 are extended in the length direction (X-axis direction).

As such, according to an exemplary embodiment, each of the second partitioning portions 112b includes a pair of step portions 112b1 that is recessed inwards in the width direction (Y-axis direction) from the pair of fixing ends 111, and a linear portion 112b2 linearly connecting the pair of step portions 112b1. In this manner, rigidity balance between the first partitioning portions 112a and the second partitioning portions 112b may be properly maintained when the partitioning sticks 110 are extended to form atypical cell patterns. Accordingly, the partitioning sticks 110 may be prevented from deformation as force would be suppressed from being focused to one side thereof.

In this manner, as both of the first and second partitioning portions 112a and 112b are recessed in the width direction (Y-axis direction) with respect to both edges of the pair of fixing ends 111, lack of uniformity in rigidity may be reduced even when partitioning atypical cell patterns, and thus, the partitioning sticks 110 may be prevented from deformation.

The mask frame assembly 100 according to an exemplary embodiment may be used to deposit various thin films, such as forming emission layer patterns of an organic light-emitting display device.

Figure 4:
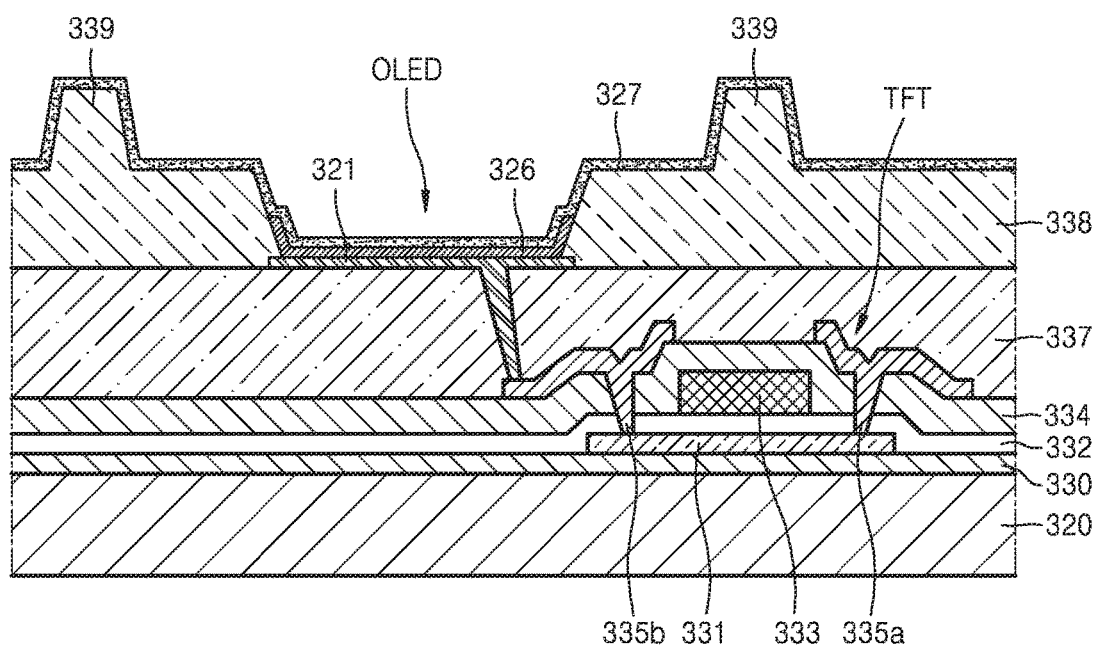
FIG. 4 is a cross-sectional view showing a detailed structure of a substrate of FIG.

FIG. 4 illustrates a structure of an organic light-emitting display device, as an example of the substrate 300 on which deposition may be performed by using the mask frame assembly 100.

Referring to FIG. 4, a buffer layer 330 is formed on a base plate 320, and a thin film transistor TFT is disposed over the buffer layer 330. The thin film transistor TFT includes an active layer 331, a gate insulating layer 332 covering the active layer 331, and a gate electrode 333 disposed on the gate insulating layer 332.

An interlayer insulating layer 334 covers the gate electrode 333, and a source electrode 335a and a drain electrode 335b are formed on the interlayer insulating layer 334. The source and drain electrodes 335a and 335b respectively contact a source region and a drain region of the active layer 331 via contact holes in the gate insulating layer 332 and the interlayer insulating layer 334.

A pixel electrode 321 of an organic light-emitting device OLED is connected to the drain electrode 335b. The pixel electrode 321 is formed on a planarization layer 337, and a pixel defining layer 338 defining sub-pixel regions is formed on the pixel electrode 321. Spacers 339 may be formed on the pixel defining layer 338 to prevent damages to the elements formed on the substrate 300 when the mask frame assembly 100 contacts the substrate 300, by maintaining a distance from the mask frame assembly 100 during deposition.

An emission layer 326 of the organic light-emitting device OLED is formed in an opening of the pixel defining layer 338, and an opposite electrode 327 is deposited on the pixel defining layer 338 and the emission layer 326. In particular, each opening surrounded by pixel defining layers 338 may be a region of a sub-pixel, such as a red pixel (R), a green pixel (G), and a blue pixel (B), and the emission layer 326 of corresponding color is formed in the opening.

The mask frame assembly 100 is arranged such that the pattern holes of the pattern region 121 correspond to the emission layer 326, and the emission layer 326 having a desired pattern may be formed thereon via the deposition process described above with reference to FIG. 1. In addition, the unit cells described above may correspond to a display region of an organic light-emitting display device.

Figure 5A:
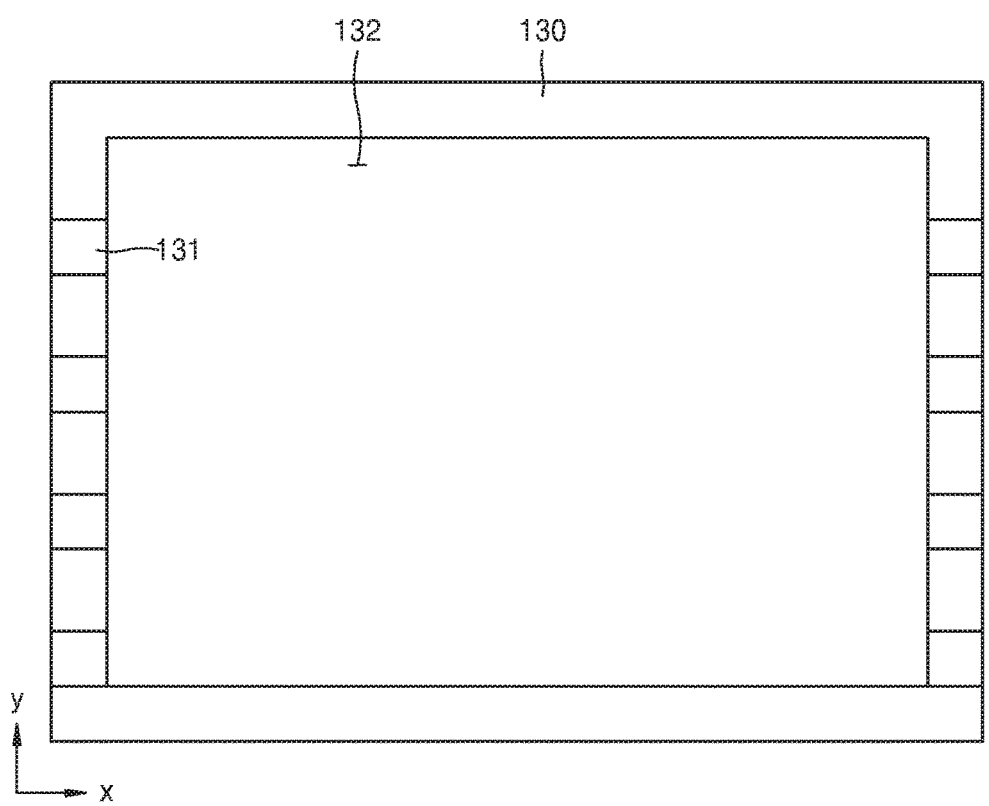
FIG. 5A, FIG. 5B, and FIG. 5C are plan views of a process of manufacturing the mask frame assembly of FIG. 2.
Figure 5B:
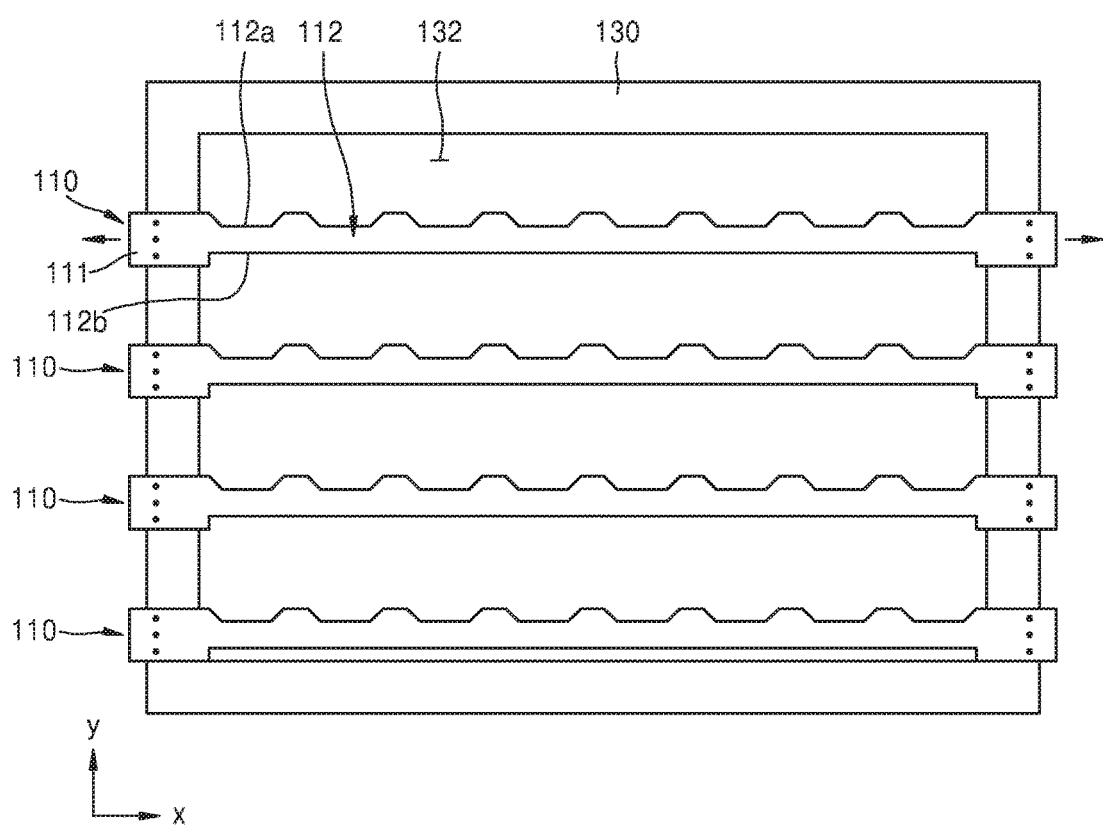
Figure 5C:
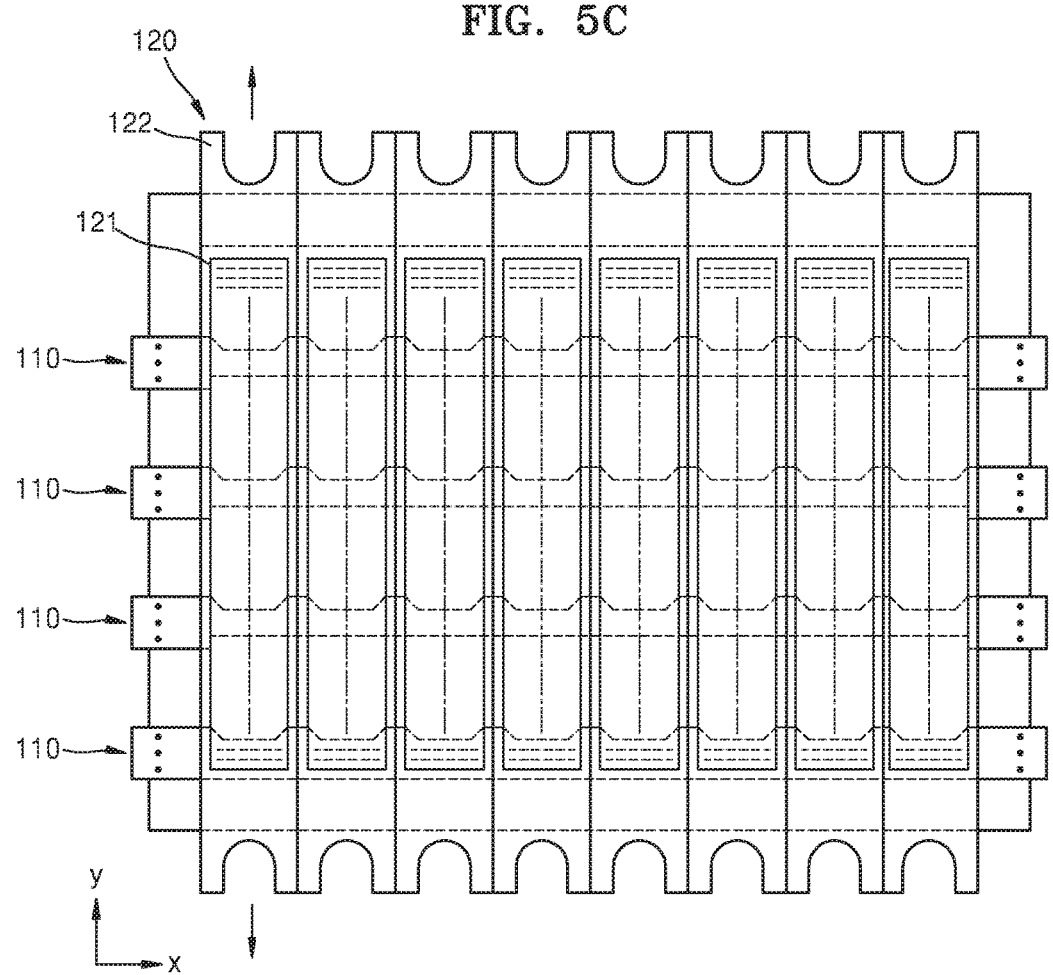

FIGS. 5A to 5C sequentially illustrate a process of manufacturing the mask frame assembly 100 according to an exemplary embodiment.

First, as shown in FIG. 5A, the frame 130 has an opening 132 formed at the center thereof. Among four sides of the frame 130 having a rectangular shape, the combining grooves 131 are formed on two sides that face each other.

Next, as shown in FIG. 5B, the partitioning sticks 110 are welded and fixed to the frame 130. More particularly, while both fixing ends 111 of each of the partitioning sticks 110 are held and extended in a length direction (X-axis direction), one of the fixing ends 111 is welded and fixed to a combining groove 131.

In this respect, as described above, the narrow width portion 112 between the fixing ends 111 includes the first partitioning portion 112a and the second partitioning portion 112b corresponding to atypical cell patterns. Both of the first and second partitioning portions 112a and 112b are depressed inwards from the fixing ends 111, and thus, properly maintain rigidity balance. Accordingly, deformation such as being bent toward one of the first and second partitioning portions 112a and 112b may be prevented while being extended.

After fixing the partitioning sticks 110, as shown in FIG. 5C, the masks 120 are welded and fixed to the other sides of the frame 130 facing each other. In particular, while the clamping portions 122 of each of the masks 120 are held and extended in a length direction (Y-axis direction) of the masks 120, the masks 120 are welded and fixed to the frame 130. After the welding, the clamping portions 122 and protrusions of the partitioning sticks 110 beyond edges of the frame 130 may be removed by cutting.

By such a process, the mask frame assembly 100 according to an exemplary embodiment may be manufactured, which may prevent deformation of the partitioning sticks 110.

As described above, the partitioning sticks 110 is welded to the frame 130 and then the masks 120 are welded to the frame 130, however, the masks 120 may be welded to the frame 130 first, and then, the partitioning sticks 110 may be welded thereon. That is, welding order of the masks 120 and the partitioning sticks 110 may be changed as needed.

According to exemplary embodiments, a mask frame assembly may prevent deformation of partitioning sticks that partition pattern regions of masks into unit cell patterns. Accordingly, when the mask frame assembly is used in a deposition process, desired patterns may be deposited on an accurate location of a substrate, and thus, stable product quality may be obtained.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A mask frame assembly comprising:
   a frame;
   a mask coupled to the frame and comprising a pattern region for deposition; and
   a partitioning stick coupled to the frame and configured to partition the pattern region of the mask into unit cell patterns,
   wherein the partitioning stick comprises:
   a pair of opposing fixing ends fixed to sides of the frame; and
   a narrow width portion connecting the pair of fixing ends and comprising a first partitioning portion and a second partitioning portion respectively recessed inwards from both edges of the fixing ends in a width direction.

2. The mask frame assembly of claim 1, wherein:
   the first partitioning portion defines a first boundary line of the unit cell patterns; and
   the second partitioning portion defines a second boundary line of the unit cell patterns opposing the first boundary line.

3. The mask frame assembly of claim 1, wherein:
   the first partitioning portion non-linearly connects the pair of fixing ends; and
   the second partitioning portion linearly connects the pair of fixing ends.

4. The mask frame assembly of claim 3, wherein the first partitioning portion comprises a concave portion and a protruding portion alternately disposed with each other.

5. The mask frame assembly of claim 4, wherein a slope is formed with respect to the width direction between the concave portion and the protruding portion.

6. The mask frame assembly of claim 3, wherein the second partitioning portion comprises:
   a pair of step portions recessed in parallel to the width direction and inward from the pair of fixing ends; and
   a linear portion linearly connecting the pair of step portions.

7. The mask frame assembly of claim 1, wherein the mask crosses the partitioning stick at right angles.

* * * * *